United States Patent
Miettinen et al.

(10) Patent No.: US 6,900,715 B2
(45) Date of Patent: May 31, 2005

(54) FASTENING DEVICE

(75) Inventors: Osmo Rainer Miettinen, Vaasa (FI); Matti Johannes Pussinen, Laihia (FI)

(73) Assignee: Vacon Oyj, Vaasa (FI)

( * ) Notice: Subject to any disclaimer, the term of this patent is extended or adjusted under 35 U.S.C. 154(b) by 68 days.

(21) Appl. No.: 10/445,847

(22) Filed: May 28, 2003

(65) Prior Publication Data

US 2004/0104800 A1 Jun. 3, 2004

(30) Foreign Application Priority Data

May 31, 2002 (FI) .............................................. 20021039

(51) Int. Cl.$^7$ .............................................. H01F 27/06
(52) U.S. Cl. ...................................... 336/65; 336/229
(58) Field of Search ........................... 336/65, 229, 92, 336/85, 90, 67, 192

(56) References Cited

U.S. PATENT DOCUMENTS

| | | | |
|---|---|---|---|
| 4,267,404 A | | 5/1981 | Rohde |
| 4,754,250 A | * | 6/1988 | Duin ............................ 336/65 |
| 4,833,436 A | | 5/1989 | Martin et al. |
| 5,319,341 A | * | 6/1994 | Bisbee et al. .................. 336/67 |
| 5,488,344 A | * | 1/1996 | Bisbee et al. ............... 336/206 |
| 6,424,246 B1 | * | 7/2002 | Kysely et al. ................. 336/90 |
| 6,498,558 B1 | * | 12/2002 | Linkner et al. .............. 336/208 |

FOREIGN PATENT DOCUMENTS

| | | |
|---|---|---|
| DE | G 87 14 501 4 | 2/1988 |
| DE | 43 21 872 A1 | 2/1995 |
| FR | 2721137 | 12/1995 |
| GB | 2 257 307 A | 1/1993 |
| JP | A 8-138944 | 5/1996 |
| JP | A 2000-216025 | 1/1999 |
| JP | A 2000-216025 | 8/2000 |

* cited by examiner

*Primary Examiner*—Anh Mai
(74) *Attorney, Agent, or Firm*—Oliff & Berridge, PLC

(57) ABSTRACT

The invention relates to a fastening device for fastening a toroidal choking coil (1) to a base or the like, the toroidal choking coil comprising an inner circumference defined by a surface parallel with an axis of rotation of the toroidal choking coil and located closest to the axis of rotation. The toroidal choking coil further comprises an outer circumference defined by a surface parallel with the axis of rotation of the toroidal choking coil and located outermost from the axis of rotation, and side surfaces defined by surfaces perpendicular to the axis of rotation of the toroidal choking coil and connecting the inner circumference and the outer circumference. The fastening device for a toroidal choking coil of the invention comprises at least one pair of choking coil fasteners (3) consisting of a first choking coil fastener (3a) and a second choking coil fastener (3b), arranged to be installed on opposite side surfaces of the toroidal choking coil (1), and that at least one choking coil fastener (3a, 3b) is arranged to come at least partly into contact with the outer circumference of the toroidal choking coil (1) and at least one choking coil fastener (3a, 3b) is arranged to come at least partly into contact with the inner circumference of the toroidal choking coil (1).

9 Claims, 6 Drawing Sheets

FASTENING DEVICE

BACKGROUND OF THE INVENTION

The invention relates to a fastening device according to the preamble of claim 1 for fastening at least one toroidal choking coil to an electric device or the like.

A toroidal choking coil is an electrotechnical component wound around a toroidal iron core; more specifically, a coil used for filtering interference in an electric current. A device for fastening a toroidal choking coil refers to a device enabling a toroidal choking coil to be fastened to an electric device or a corresponding base.

According to a known solution, a toroidal choking coil is fastened to a base by using a metal collar covered by an insulating sleeve and tightened around the toroidal choking coil by a screw. Since in an implementation according to this solution a large part of the outer circumference of the toroidal choking coil is covered by the insulating sleeve, the toroidal choking coil does not cool down very efficiently. Furthermore, in this solution, in order for the toroidal choking coil to be fastened in a sufficiently strong manner, the screw has to be tightened strongly, which may cause the base to warp.

SUMMARY OF THE INVENTION

An object of the invention is to alleviate the cooling of a toroidal choking coil while simultaneously ensuring a sufficient fastening to a base. The object of the invention is achieved by a fastening device for a toroidal choking coil which is characterized by what has been disclosed in the independent claim. Preferred embodiments of the invention are disclosed in the dependent claims. Choking coil fasteners can be fastened directly to a choking coil profile, which also serves as a guard of the choking coil against external interference and interference caused by the choking coil itself.

The idea underlying the invention is that a fastening device for a toroidal choking coil consists of one or more pairs of choking coil devices that can be pressed against the choking coil by a connecting device. This enables the pairs of choking coil devices to be strongly closed, and it is ensured that the choking coils are not allowed to rub against each other. It is typical of toroidal choking coils the their outer dimensions are not the same but vary due to winding. A connecting device of the invention, however, enables an arrangement suitable for different outer dimensions to be provided. Furthermore, the connecting device makes the fastening of more than one toroidal choking coil firmer by locking the toroidal choking coils together by pairs of choking coil devices.

The choking coil devices are arranged such that the parts of the pairs of choking coil devices cooperate to support the toroidal choking coil along its inner circumference and possibly along its outer circumference and its side surfaces as well. The choking coil devices of the invention enable the toroidal choking coil to be supported such that the outer circumference of the toroidal choking coil does not come into contact with its base. In such a case, the toroidal choking coil is covered as little as possible, enabling cooling also along a section against the base of the toroidal choking coil.

Further advantages of the fastening device for a toroidal choking coil of the invention include low manufacturing and installation costs. When the fastening device is made of a preferred plastic material or another non-conducting material, it is possible to manufacture such elements in serial, which reduces manufacturing costs. Installation time and the related costs are considerably low since the small number of parts and easy installability are characteristic of the fastening device of the invention.

BRIEF DESCRIPTION OF THE DRAWINGS

The invention is now described in closer detail in connection with the preferred embodiments and with reference to the accompanying drawings, in which.

DETAILED DESCRIPTION OF THE INVENTION

Figure 1:
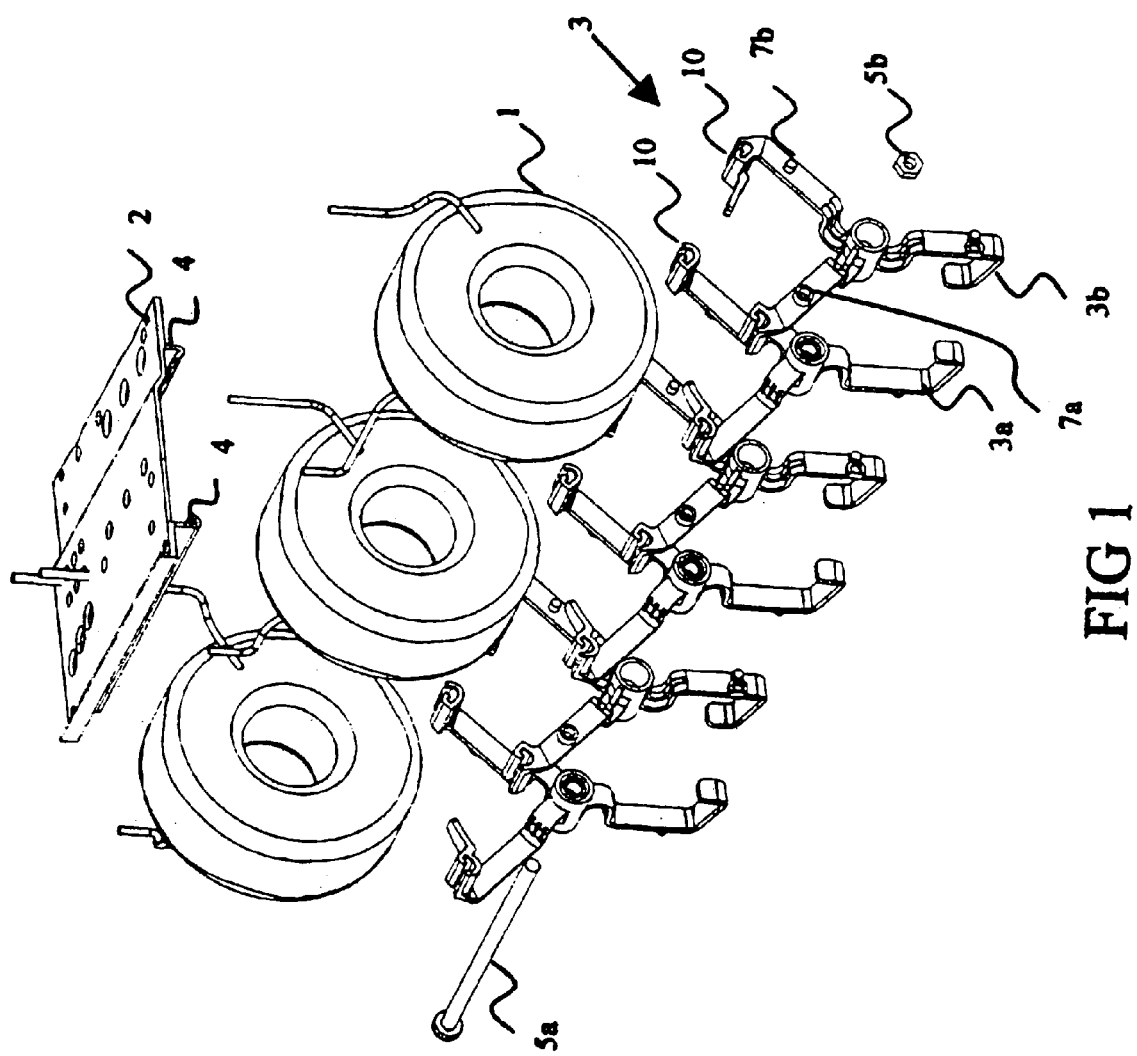
FIG. 1 shows parts of a fastening device for a toroidal choking coil according to an embodiment of the invention.

FIGS. 1 to 6 illustrate the structure of fastening devices for a toroidal choking coil according to two different embodiments of the invention. Referring to FIGS. 1 to 6, a choking coil profile 2, which is provided with two choking coil bars 4 parallel with the main plane of the choking coil profile 2, serves as a frame of the fastening device for a toroidal choking coil. In some special cases, the choking coil bar or bars 4 may, for example, be perpendicular to the main plane of the choking coil profile 2. The choking coil profile 2 may be substantially planar, as in FIGS. 1 to 3, but if desired, it may also be L-shaped or U-shaped, or it may take any shape at all, taking into account e.g. the strength required from the fastening of a toroidal choking coil, however.

The choking coil profile 2 preferably comprises two choking coil bars 4 but, if desired, only one bar or more than two bars can be used. A choking coil bar 4 herein refers to any fastening bar or a corresponding structure which allows a toroidal choking coil 1 to be installed therein and a combination of corresponding one or more pairs of choking coil fasteners 3 to move substantially parallel with the particular bar only. A pair of choking coil fasteners 3 consists of a first choking coil fastener 3a and a second choking coil fastener 3b. When such a pair of choking coil fasteners 3 can be fastened to the bar 4, no perforations for fastenings, such as e.g. screw fastenings, are needed in the base. A more uniform base, such as the uniformity of the choking coil profile 2 herein, is advantageous for protecting against interference. When the bars 4 are already arranged in the choking coil profile 2, they provide a strong and secure fastening in a direction perpendicular to the direction of the bar 4.

The choking coil fasteners 3a and 3b according to both FIGS. 1 to 3 and FIGS. 4 to 6 are designed such that the basic profile of the choking coil fasteners resembles the letter Y when viewed in a direction of an axis of rotation of the toroidal choking coil 1, the two branches of the Y being provided with counterparts for installation in corresponding choking coil bars 4. As viewed in the direction of the axis of rotation of the toroidal choking coil, the basic profile of the choking coil fasteners 3a and 3b may be different from that shown in FIGS. 1 to 6, taking into account the need for cooling and the strength required from the fastening of the toroidal choking coil 1, however.

The choking coil fasteners of FIGS. 1 to 6 are designed to operate in pairs, i.e. two choking coil fasteners 3a, 3b are used per one toroidal choking coil 1, the toroidal choking coil 1 being pressed between the two choking coil fasteners as desired, using a pair of connecting devices 5 consisting of a first connecting device 5a and a second connecting device 5b, which may comprise e.g. a nut and a screw. Preferably, the connecting devices 5a and 5b are arranged to squeeze a pair of choking coil fasteners 3 at the axis of rotation of the toroidal choking coil 1.

Figure 4:
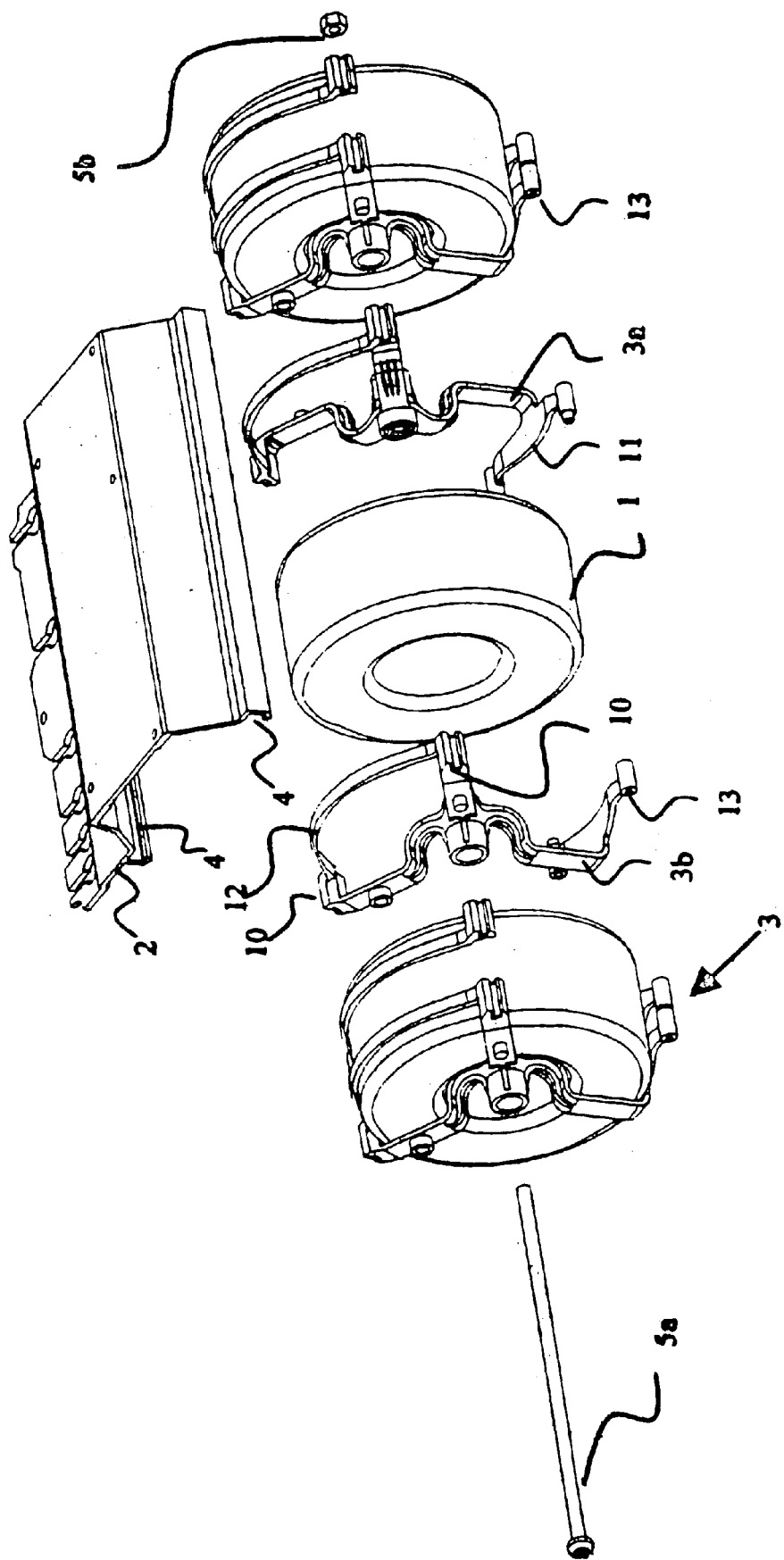
FIG. 4 shows parts of a fastening device for a toroidal choking coil according to another embodiment of the invention.

A pair of connecting devices 5 is also shared by several toroidal choking coils 1. FIGS. 1 and 4 show an embodiment wherein a pair of connecting devices 5 is provided for three toroidal choking coils but a pair of connecting devices 5 may easily be manufactured for a desired number of toroidal choking coils 1 by varying the length of the first connecting device 5a. When the pair of connecting devices 5 is e.g. as shown in FIGS. 1 and 4, a shared pair of connecting devices 5 provides the fastening of all three toroidal choking coils with additional support conjointly such that the toroidal choking coils 1 are prevented from moving with respect to each other.

If desired, the choking coil fasteners 3a and 3b can be designed such that more than two choking coil fasteners are used for one toroidal choking coil 1 or, alternatively, only one choking coil fastener can be used per each toroidal choking coil. A tip of the branch of each choking coil fastener 3a, 3b of the fastening device for a toroidal choking coil of FIGS. 1 to 3 that has no connection with the choking coil bar 4 is substantially U-shaped, so that it comes into contact with both sides of the toroidal choking coil 1 perpendicular to the axis of rotation and with a side defined by the outer circumference of the toroidal choking coil. In the fastening device for a toroidal choking coil of FIGS. 4 to 6, a tip of the branch of each choking coil fastener 3a, 3b that has no connection with the choking coil bar 4 is provided with a supporting strip 11 which comes into contact with a side of the toroidal choking coil 1 defined by the outer circumference of the toroidal choking coil, the particular element being much wider in a direction of the circumference of the toroidal choking coil than the branch of the choking coil fastener provided with the supporting strip 11.

Figure 2:
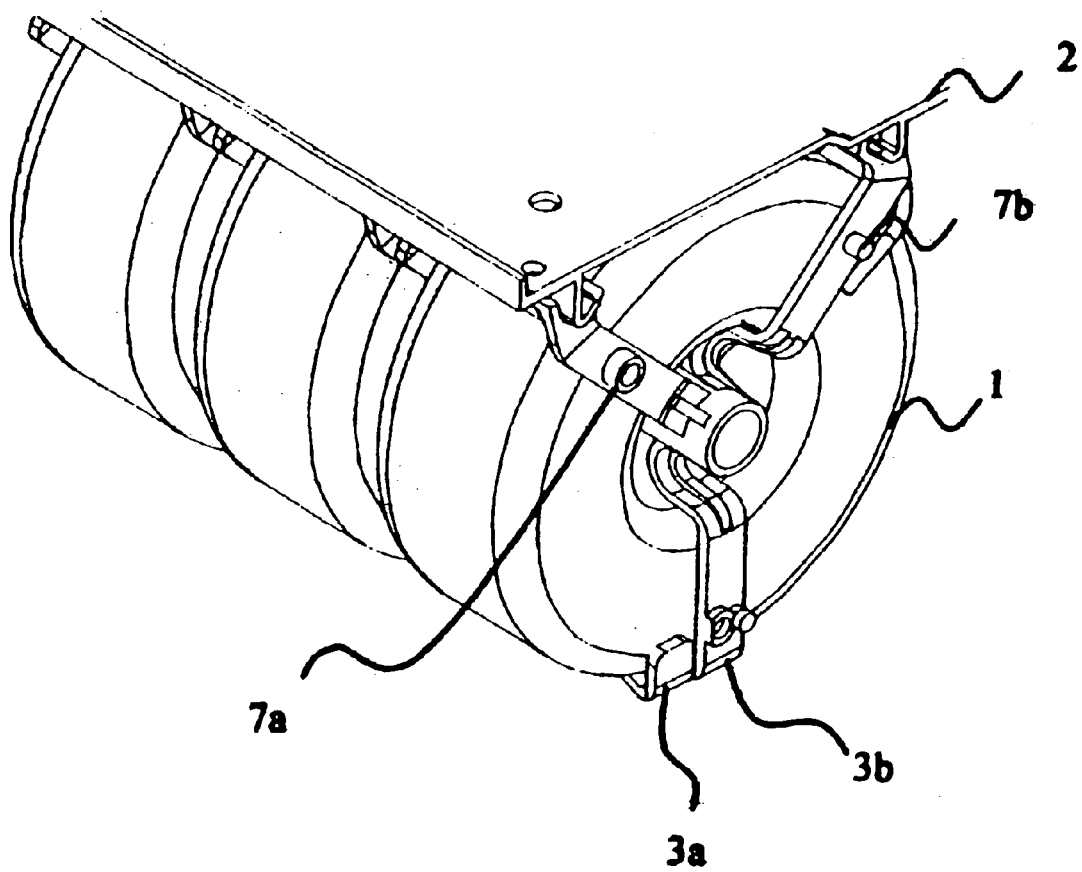
FIG. 2 shows a fastening device for a toroidal choking coil assembled from the parts of FIG. 1, as seen obliquely from above.
Figure 3:
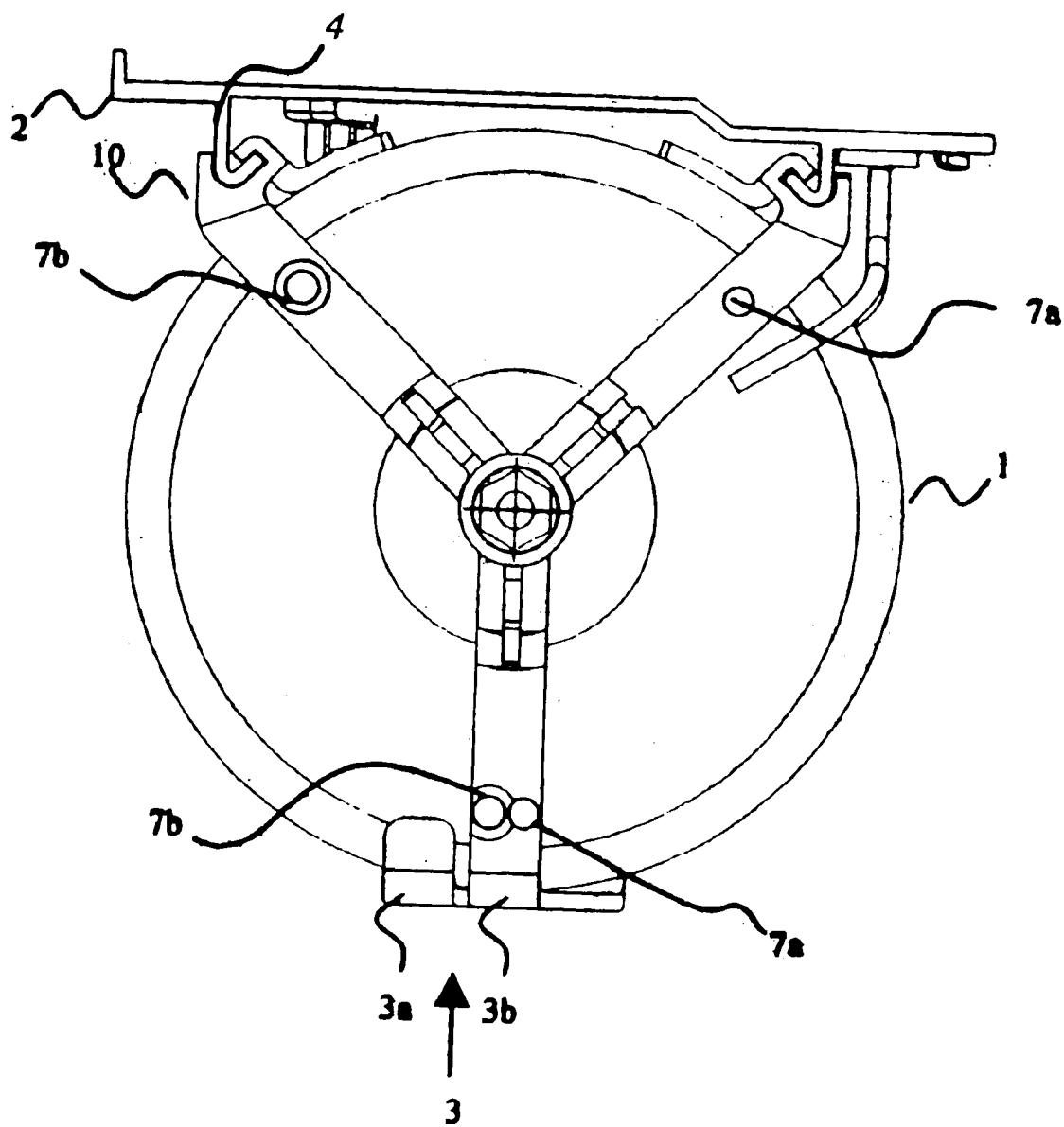
FIG. 3 is a side view showing the fastening device for a toroidal choking coil of FIG. 2.

In the fastening device for a toroidal choking coil of FIGS. 1 to 3, one of the branches of each choking coil fastener 3a, 3b that has a connection with the choking coil bars 4 is provided with an element which comes into contact with the side of the toroidal choking coil 1 defined by the outer circumference of the toroidal choking coil. The branches of each choking coil fastener 3a, 3b of the fastening device for a toroidal choking coil of FIGS. 4 to 6 that have a connection with the choking coil bars 4 are interconnected by a supporting arch 12 which comes into contact with the side of the toroidal choking coil 1 defined by its outer circumference. The purpose of this supporting element connecting the branches is to further enhance the strength e.g. when fastening heavier choking coils to their base.

Figure 5:
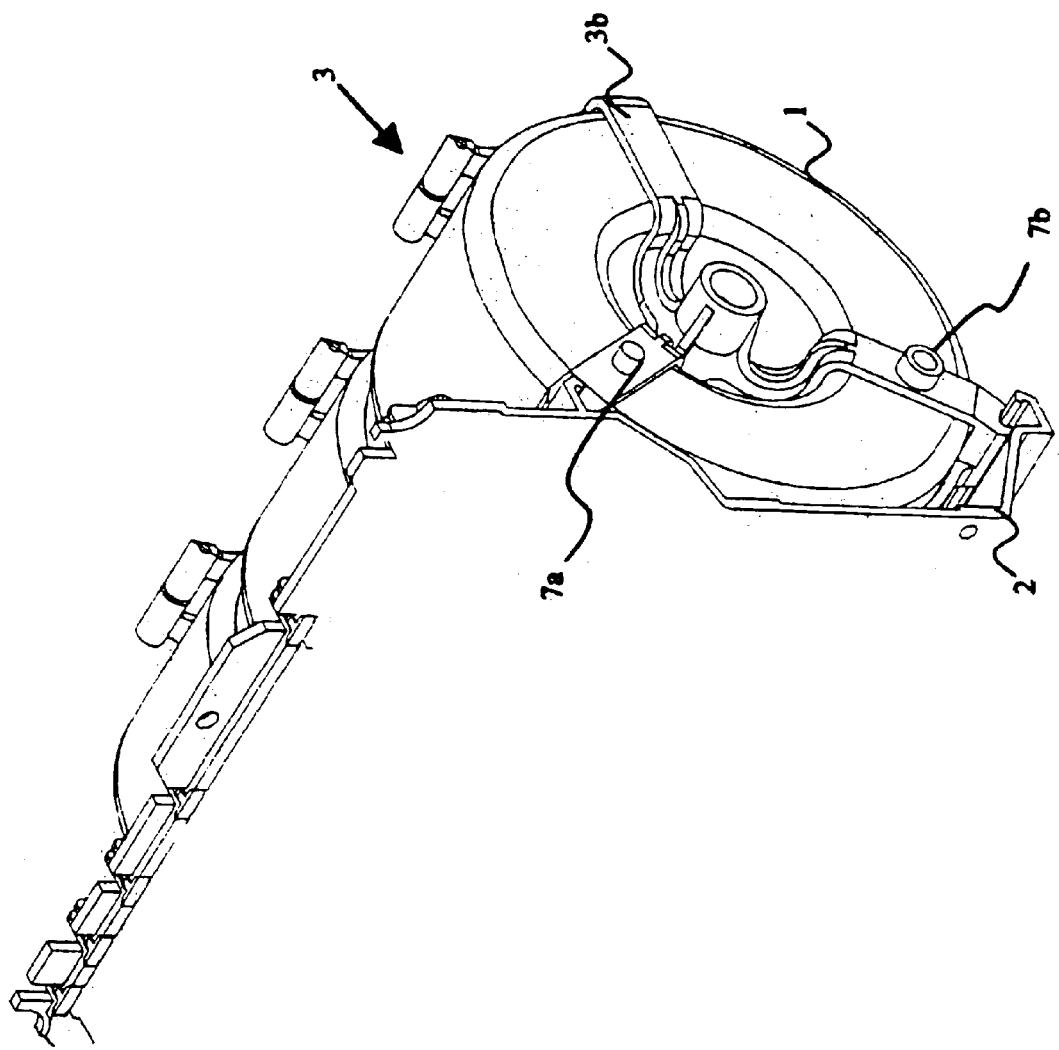
FIG. 5 shows a fastening device assembled from the parts of FIG. 4, as seen obliquely from above.
Figure 6:
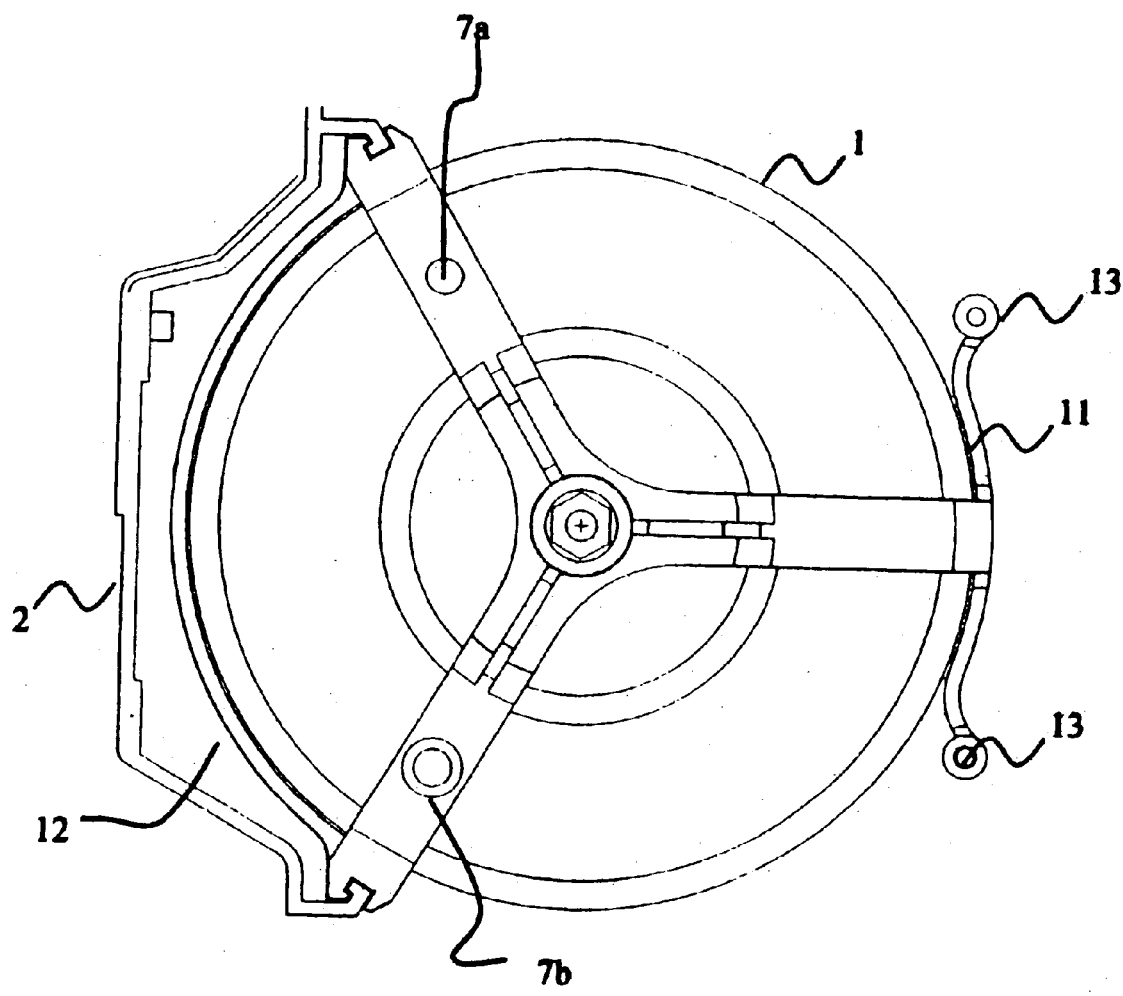
FIG. 6 is a side view showing the fastening device for a toroidal choking coil of FIG. 5.

In the branch of the choking coil fastener of the fastening device for a toroidal choking coil of FIGS. 4 to 6 that has no connection contact with the choking coil bar, the choking coil fasteners 3a and 3b can be interconnected by a support strip 11 residing at an end of the branch, such a support strip also enabling a connecting element 7a and a counterpart 7b to be arranged therein. It is possible to provide this support strip 11 with a support point against a possible back panel or another corresponding support point in order to provide additional strength.

When more than one toroidal choking coil 1 is connected to the choking coil profile 2, the choking coil fasteners 3a, 3b of adjacent toroidal choking coils can be interconnected using a connecting element 7a and a counterpart 7b provided in the particular choking coil fasteners, which both, as shown in FIGS. 1 to 6, may comprise e.g. pins and corresponding recesses. The first and the second choking coil fasteners 3a and 3b of a pair of choking coil fasteners supporting one toroidal choking coil 1 may also be provided with connecting elements 7a and counterparts 7b such that the choking coil fasteners can be interconnected by the connecting elements 7a and the counterparts 7b. If desired, the connecting elements 7a and the counterparts 7b may comprise parts separate from the choking coil fasteners 3a, 3b but, preferably, they are provided in the choking coil fasteners. The purpose of the connecting element 7a and the counterpart 7b is to strengthen the fastening of the toroidal choking coil 1.

The choking coil fasteners 3a, 3b may also come into contact with a surface of the toroidal choking coil 1 defined by its inner circumference, wherefore they thus support the toroidal choking coil in a direction of its radius, from a direction of a center of the toroidal choking coil. Preferably, such support is implemented by providing in the choking coil fastener 3a, 3b, at a center hole in the toroidal choking coil 1, at least one element pressing the tighter against the inner circumference of the toroidal choking coil 1 the tighter the particular choking coil fastener 3a, 3b is pressed against the toroidal choking coil. In practice, such support comprises e.g. a wedge-shaped element preferably provided in the choking coil fastener 3a, 3b. In FIGS. 1 to 6, the above-mentioned support is implemented by bending the branches of the choking coil fasteners 3a, 3b in the vicinity of hubs of the choking coil fasteners such that they are at a slight angle with respect to the axis of rotation of the toroidal choking coil 1, wherefore they operate in the wedge-shaped manner as described above when the choking coil fastener 3a, 3b is pressed against the toroidal choking coil 1.

By implementing the support of the toroidal choking coil 1 from the direction of the inner circumference in the manner of FIGS. 1 to 6, the support of the toroidal choking coil can be strengthened from all desired directions by pressing the choking coil fasteners 3a, 3b supporting the toroidal choking coil tighter against the particular toroidal choking coil in the direction of the axis of the toroidal choking coil. The support in the direction of the inner circumference of the toroidal choking coil 1 becomes stronger because of the above-described wedge effect while in the direction of the outer circumference of the toroidal choking coil because, when the inner circumferential support becomes stronger, an angle of the parts of the branches of the choking coil fasteners 3a, 3b in the vicinity of a hub of the toroidal choking coil with respect to the axis of the toroidal choking coil is increasingly reduced, wherefore the length of the branches of the choking coil fasteners decreases in the direction of the radius of the toroidal choking coil; this, again, causes the elements provided in the choking coil fasteners that come into contact with the outer circumference of the toroidal choking coil to be pressed against the outer circumference even tighter.

As has been shown above, when the forces affecting the choking coil fasteners. 3a, 3b in the direction of the axis of the toroidal choking coil are increased the support in the direction of the radius of the toroidal choking coil 1 can preferably be strengthened such that the parts of the choking coil fasteners in the vicinity of the hub of the toroidal choking coil are wedge-shaped and flexible. Consequently, it is of course clear that the desired flexibility properties are to be taken into account in the choice of materials, so that the suitable supporting properties are achieved by a combined effect of the design and material properties of the choking coil fastener.

The choking coil fasteners 3a, 3b of the pair of choking coil fasteners used for fastening the toroidal choking coil 1 are preferably similar to each other, but in special cases choking coil fasteners different from each other may also be used for fastening the toroidal choking coil.

The connecting devices of the choking coil fasteners are preferably arranged to enable all toroidal choking coils 1 and corresponding choking coil fasteners 3a, 3b that are to be fastened to the choking coil profile 2 to be combined into one integral whole. The integral whole consisting of the toroidal choking coils 1 and the choking coil fasteners 3a, 3b can be supported in a direction of the choking coil bar 4 such that the choking coil fasteners are arranged to change their shape when subjected to pressing forces in the direction of the axis of the toroidal choking coil such that friction between the choking coil fasteners and the choking coil bars increases considerably, so that the integral whole consisting of the toroidal choking coil 1 and the choking coil fasteners 3a, 3b is no longer allowed to move freely in the direction of the choking coil bar. If desired, the support in the direction of the choking coil bar 4 of the integral whole consisting of the toroidal choking coils 1 and the choking coil fasteners 3a, 3b may also comprise suitable separate support elements (not shown).

In the fastening devices for a toroidal choking coil of FIGS. 1 to 6, the support of the integral whole consisting of the toroidal choking coils 1 and the corresponding choking coil fasteners 3a, 3b in the direction of the choking coil bar 4 is achieved by utilizing the above-described flexible structure of the choking coil fasteners 3a, 3b. When the choking coil fasteners of FIGS. 1 to 6 are subjected to pressing forces in the direction of the axis of rotation of the toroidal choking coil, and the dimension in the direction of the radius of the toroidal choking coil of the choking coil fasteners decreases in the manner described above, the elements in the choking coil fasteners 3a, 3b provided for installation in the choking coil bar 4 press against the choking coil bars, so that the increased friction provides sufficient support in the direction of the choking coil bars.

Preferably, the choking coil profile 2 is manufactured of aluminum while the choking coil fasteners 3a, 3b may be manufactured e.g. of plastic but, if desired, other production materials may also be used.

It is to be noted that although parts of the toroidal choking coil 1 have herein been referred to as "circumference" and "axis of rotation", the toroidal choking coil 1 of the invention does not have to be substantially toroidal as viewed from the side but it may, for instance, be substantially quadratic or polygonal. Consequently, e.g. in the case of the above-mentioned choking coil that is quadratic as viewed from the side, the term "axis of rotation" refers to an axis of center of gravity, etc. It is also clear that the "axis of rotation" herein refers to an imaginary central axis of a toroidal choking coil, not to a concrete structure.

Furthermore, it is clear that when the choking coil fastener 3a, 3b is said to come into contact with a particular surface of the toroidal choking coil 1, this means that the choking coil fastener supports the toroidal choking coil from the direction of the particular surface.

It is obvious to one skilled in the art that the basic idea of the invention can be implemented in many different ways. The invention and its embodiments are thus not restricted to the above-described examples but may vary within the scope of the claims.

What is claimed is:

1. A fastening device for fastening a toroidal choking coil to a base or the like, the toroidal choking coil comprising:
   an inner circumference defined by a surface parallel with an axis of rotation of the toroidal choking coil and located closest to the axis of rotation;
   an outer circumference defined by a surface parallel with the axis of rotation of the toroidal choking coil and located outermost from the axis of rotation, and;
   side surfaces defined by surfaces perpendicular to the axis of rotation of the toroidal choking coil and connecting the inner circumference and the outer circumference, the fastening device comprising at least one pair of choking coil fasteners, comprising:
   a first choking coil fastener and
   a second choking coil fastener, arranged to be installed on opposite side surfaces of the toroidal choking coil, and that at least one choking coil fastener is arranged to come at least partly into contact with the outer circumference of the toroidal choking coil and at least one choking coil fastener is arranged to come at least partly into contact with the inner circumference of the toroidal choking coil, wherein each choking coil fastener comprises branches as viewed in a direction of rotation of the toroidal choking coil, and the fastening device further comprises a pair of connecting devices comprising a first connecting device and a second connecting device which, interconnected, are arranged to subject at least one pair of choking coil fasteners to forces that are parallel with the axis of rotation of the toroidal choking coil and directed toward a center of the toroidal choking coil, enabling the toroidal choking coil to be squeezed between the at least one pair of choking coil fasteners.

2. The fastening device of claim 1, wherein the first choking coil fastener and the second choking coil fastener of the at least one pair of choking coil fasteners are mutually identical in shape.

3. The fastening device of claim 2, wherein the first choking coil fastener and the second choking coil fastener of the at least one pair of choking coil fasteners have three branches as viewed in a direction of an axis of rotation of the toroidal choking coil.

4. The fastening device of claim 1, wherein at least one choking coil fastener is arranged to come into contact with at least one of the side surfaces of the toroidal choking coil.

5. The fastening device of claim 1, wherein the first choking coil fastener is provided with at least one connecting element arranged to connect the first choking coil fastener to the second choking coil fastener provided with a counterpart of the connecting element provided in the first choking coil fastener.

6. The fastening device of claim 1, wherein at least one choking coil fastener is arranged such that when the choking coil fastener is pressed against the corresponding toroidal choking coil in the direction of the axis of rotation of the toroidal choking coil, forces directed at the toroidal choking coil by the choking coil fastener that are substantially parallel with a radius of the toroidal choking coil increase, the increasing forces parallel with the radius being either forces affecting outwardly from the inner circumference of the toroidal choking coil or forces affecting toward the center of the toroidal choking coil from the outer circumference of the toroidal choking coil, or both.

7. The fastening device for a toroidal choking coil of claim 1, wherein at least one choking coil fastener is arranged to fasten to a choking coil profile of the toroidal choking coil by a grip element arranged in the choking coil fastener.

8. The fastening device of claim 1, wherein at least one branch of a pair of choking coil fasteners is provided with a grip element for fastening the pair of choking coil fasteners to a choking coil bar arranged in the choking coil profile.

9. The fastening device for a toroidal choking coil of claim 8, wherein at least one choking coil bar is arranged such that when the choking coil bar is squeezed, friction between the choking coil fastener and the choking coil bar increases substantially, enabling an integral whole consisting of the choking coil fastener and the corresponding toroidal choking coil to be prevented from moving freely in a direction of the choking coil bar.

* * * * *